(12) United States Patent
Park et al.

(10) Patent No.: US 10,325,887 B2
(45) Date of Patent: Jun. 18, 2019

(54) LIGHT EMITTING DEVICE AND DISPLAY DEVICE HAVING SAME

(71) Applicant: LG INNOTEK CO., LTD., Seoul (KR)

(72) Inventors: Sun Woo Park, Seoul (KR); Myung Sub Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/751,414

(22) PCT Filed: Aug. 11, 2016

(86) PCT No.: PCT/KR2016/008852
§ 371 (c)(1),
(2) Date: Feb. 8, 2018

(87) PCT Pub. No.: WO2017/026820
PCT Pub. Date: Feb. 16, 2017

(65) Prior Publication Data
US 2018/0226384 A1 Aug. 9, 2018

(30) Foreign Application Priority Data

Aug. 12, 2015 (KR) .................. 10-2015-0113690

(51) Int. Cl.
*H01L 33/00* (2010.01)
*H01L 25/075* (2006.01)
(Continued)

(52) U.S. Cl.
CPC ............ *H01L 25/0753* (2013.01); *G09F 9/33* (2013.01); *H01L 33/00* (2013.01); *H01L 33/48* (2013.01);
(Continued)

(58) Field of Classification Search
CPC ..... H01L 25/0753; H01L 33/52; H01L 33/58; H01L 33/50; H01L 33/30; H01L 33/642; H01L 33/647; H01L 33/0025; H01L 33/62; G09F 9/33
See application file for complete search history.

(56) References Cited

U.S. PATENT DOCUMENTS

2007/0189007 A1* 8/2007 Nishimoto .............. H01L 24/97
362/227
2010/0117099 A1 5/2010 Leung
(Continued)

FOREIGN PATENT DOCUMENTS

CN 101021499 8/2007
CN 102272951 12/2011
(Continued)

OTHER PUBLICATIONS

European Search Report dated Apr. 2, 2019 issued in Application No. 16835460.3.
(Continued)

*Primary Examiner* — Ahmed N Sefer
(74) *Attorney, Agent, or Firm* — Ked & Associates, LLP

(57) ABSTRACT

A light emitting element disclosed in an embodiment comprises: a support substrate having a plurality of pads and a black matrix layer outside the plurality of pads; a plurality of light emitting chips, at least one of which is disposed on at least one of the plurality of pads; and a light-transmitting resin layer which is disposed on the support substrate and covers the pads, the black matrix layer, and the light emitting chips.

19 Claims, 13 Drawing Sheets

(51) Int. Cl.
*G09F 9/33* (2006.01)
*H01L 33/48* (2010.01)
*H01L 33/50* (2010.01)
*H01L 33/52* (2010.01)
*H01L 33/58* (2010.01)
*H01L 33/62* (2010.01)
*H01L 33/30* (2010.01)
*H01L 33/64* (2010.01)

(52) U.S. Cl.
CPC .............. *H01L 33/50* (2013.01); *H01L 33/52* (2013.01); *H01L 33/58* (2013.01); *H01L 33/62* (2013.01); *H01L 33/0025* (2013.01); *H01L 33/30* (2013.01); *H01L 33/642* (2013.01); *H01L 33/647* (2013.01); *H01L 2224/48227* (2013.01); *H01L 2224/48237* (2013.01); *H01L 2224/49113* (2013.01)

(56) References Cited

U.S. PATENT DOCUMENTS

| | | |
|---|---|---|
| 2011/0006316 A1 | 1/2011 | Ing et al. |
| 2012/0015464 A1 | 1/2012 | Chien et al. |
| 2012/0080692 A1* | 4/2012 | Ohtorii ............... H01L 25/0753 257/88 |
| 2016/0197310 A1 | 7/2016 | Kubota et al. |

FOREIGN PATENT DOCUMENTS

| | | |
|---|---|---|
| CN | 102664178 | 9/2012 |
| CN | 203631548 | 6/2014 |
| JP | 2003-086358 | 3/2003 |
| JP | 2006-339541 | 12/2006 |
| JP | 2009-076949 | 4/2009 |
| JP | 4733434 | 7/2011 |
| JP | 2015-034948 | 2/2015 |
| KR | 10-2000-0019131 | 4/2000 |
| KR | 20-0329640 Y1 | 10/2003 |
| KR | 10-0715650 | 5/2007 |
| KR | 10-2012-0130642 | 12/2012 |
| WO | WO 2015/019532 | 2/2015 |

OTHER PUBLICATIONS

Chinese Office Action dated Mar. 4, 2019 issued in Application No. 201680047563.3.

* cited by examiner

LIGHT EMITTING DEVICE AND DISPLAY DEVICE HAVING SAME

CROSS-REFERENCE TO RELATED PATENT APPLICATIONS

This application is a U.S. National Stage Application under 35 U.S.C. § 371 of PCT Application No. PCT/KR2016/008852, filed Aug. 11, 2016, which claims priority to Korean Patent Application No. 10-2015-0113690, filed Aug. 12, 2015, whose entire disclosures are hereby incorporated by reference.

TECHNICAL FIELD

The present invention relates to a light emitting device and a display device including the same.

BACKGROUND ART

Light emitting devices such as light emitting diodes (LEDs) are a kind of semiconductor devices that convert electrical energy into light, and are being popularized as next-generation light sources in place of conventional fluorescent lamps and incandescent lamps.

Since the LED generates light by using a semiconductor device, the light emitting diode consumes very low power as compared with an incandescent lamp that generates light by heating tungsten, or a fluorescent lamp that generates light by impinging ultraviolet light generated through a high pressure discharge on a phosphor.

In general, an outdoor electronic display device is widely used as a means for informing characters and images to unspecified individuals by using one medium. The outdoor electronic display device is used as a large guide plate of the playground, a traffic information guide plate of the road, or an outdoor billboard by using the LED for each of pixels of the outdoor electronic display device.

DISCLOSURE

Technical Problem

The embodiment provides a light emitting device having a novel light absorption structure.

The embodiment provides a light emitting device having a black matrix layer provided around a light emitting chip and a display device including the same.

The embodiment provides a light emitting device having a pad including a carbon black metric under a light emitting chip and a display device including the same.

The embodiment provides a light emitting device having a pad and a light emitting chip arranged on a support substrate having a black matrix layer and a display device including the same.

The embodiment provides a light emitting device having one or more of the light emitting chips arranged on a pad including a conductive carbon black material, a display device including the same.

The embodiment provides a light emitting device having a black matrix layer and a pad formed of a conductive carbon black material around a light emitting chip, and a display device including the same.

The embodiment provides a light emitting device providing a black layer having high contrast to a support substrate and a display device including the same.

The embodiment provides an outdoor electronic display device having a black layer formed on an entire region or a partial region of a top surface of a support substrate.

Technical Solution

According to an embodiment, a light emitting device includes a support substrate having a plurality of pads on a top surface thereof and a black matrix layer outside the pads, a plurality of light emitting chips electrically connected to the pads, at least one of the light emitting chips being provided on at least one of the pads, and a transmissive resin layer provided on the support substrate to cover the pads, the black matrix layer, and the light emitting chips.

According to an embodiment, a light emitting device includes a support substrate having a plurality of pads on a top surface thereof and a black matrix layer outside the pads, a plurality of light emitting chips electrically connected to the pads, at least one of the light emitting chips being provided on at least one of the pads, and a transmissive resin layer provided on the support substrate to cover the pads, the black matrix layer, and the light emitting chips. At least one of the pads includes a conductive carbon black material and is electrically connected to at least one of the light emitting chips.

Advantageous Effects

The embodiment can improve the contrast of the light emitting device.

The embodiment can provide the light emitting device representing the contrast ratio improved by providing the layer representing the lower reflective index or the higher absorption around the light emitting chip.

The embodiment can provide the outdoor electronic display device having the light emitting device representing the higher contrast ratio.

The embodiment can improve the reliability of the light emitting device and the display device including the same.

BEST MODE

Mode for Invention

Hereinafter, the embodiment of the present invention will be described in detail with reference to accompanying drawings to allow those skilled in the art to easily reproduce the present invention. However, the present invention may be realized with various forms, but is not limited to following embodiments.

In the following description, when a predetermined part "includes" a predetermined component, the predetermined part does not exclude other components, but may further include other components unless otherwise indicate. In the description of the embodiments, it will be understood that, when a layer, a film, a region, or a plate is referred to as being "on" another layer, another film, another region, or another plate, it can be "directly" or "indirectly" on the other layer, film, region, plate, or one or more intervening layers may also be present. Meanwhile, when a layer, a film, a region, or a plate is referred to as being "directly on" another layer, another film, another region, or another plate, no intervening layer is absent.

Hereinafter, a display device and a light emitting device according to an embodiment of the present invention will be described with reference to FIGS. 1 to 4.

Figure 1:
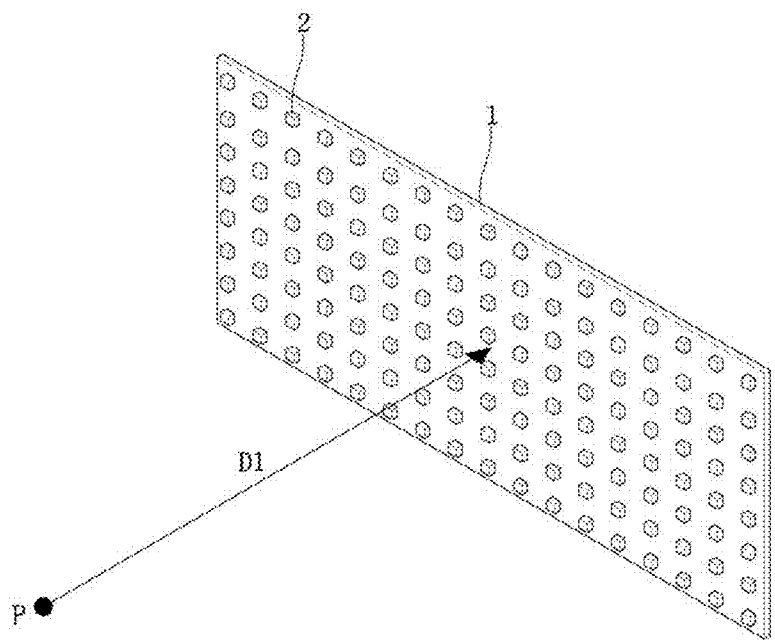
FIG. 1 is a perspective view illustrating an example of an outdoor electronic display device according to the embodiment.
Figure 2:
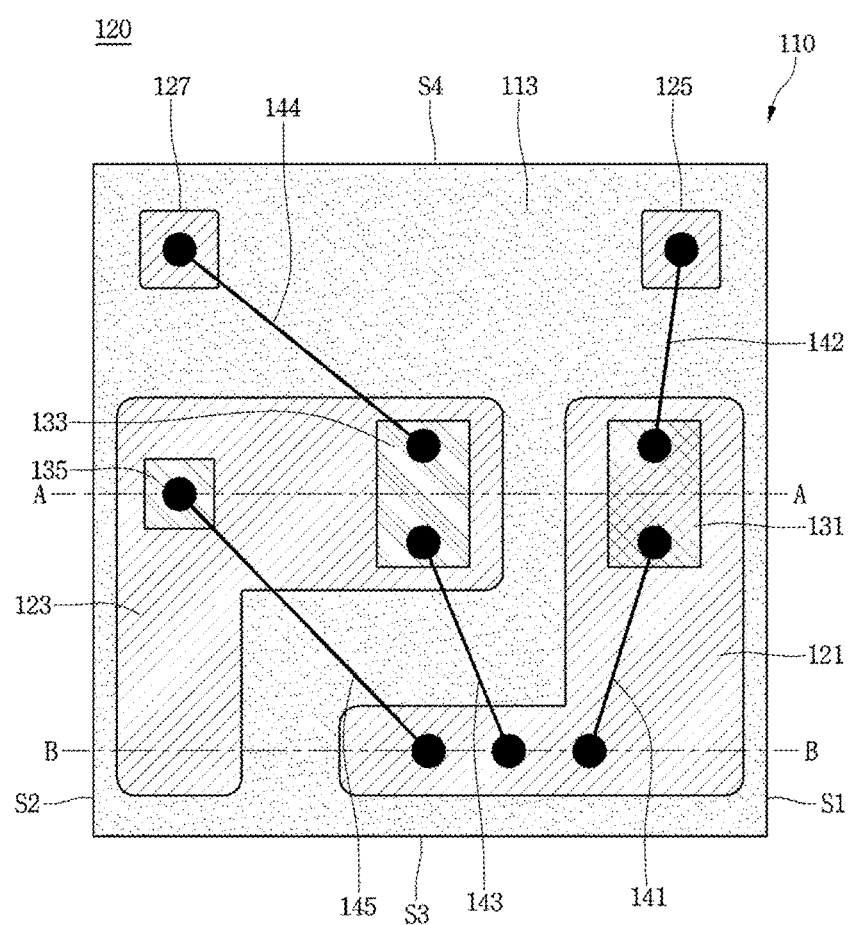
FIG. 2 is a view illustrating a light emitting device of a display device according to a first embodiment.
Figure 3:
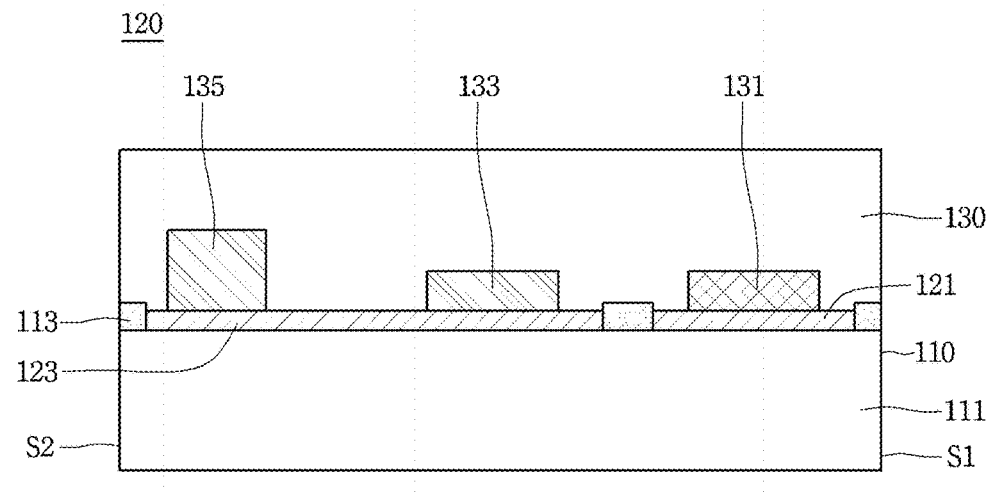
FIG. 3 is a sectional view taken along line A-A of the light emitting device of FIG. 2.
Figure 4:
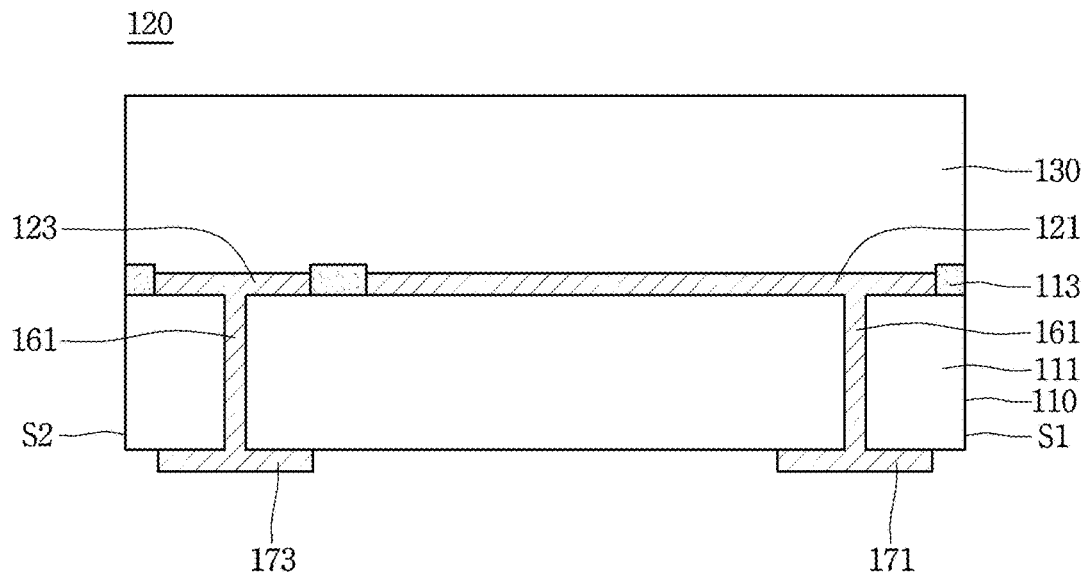
FIG. 4 is a sectional view taken along line B-B of the light emitting device of FIG. 2.
Figure 5:
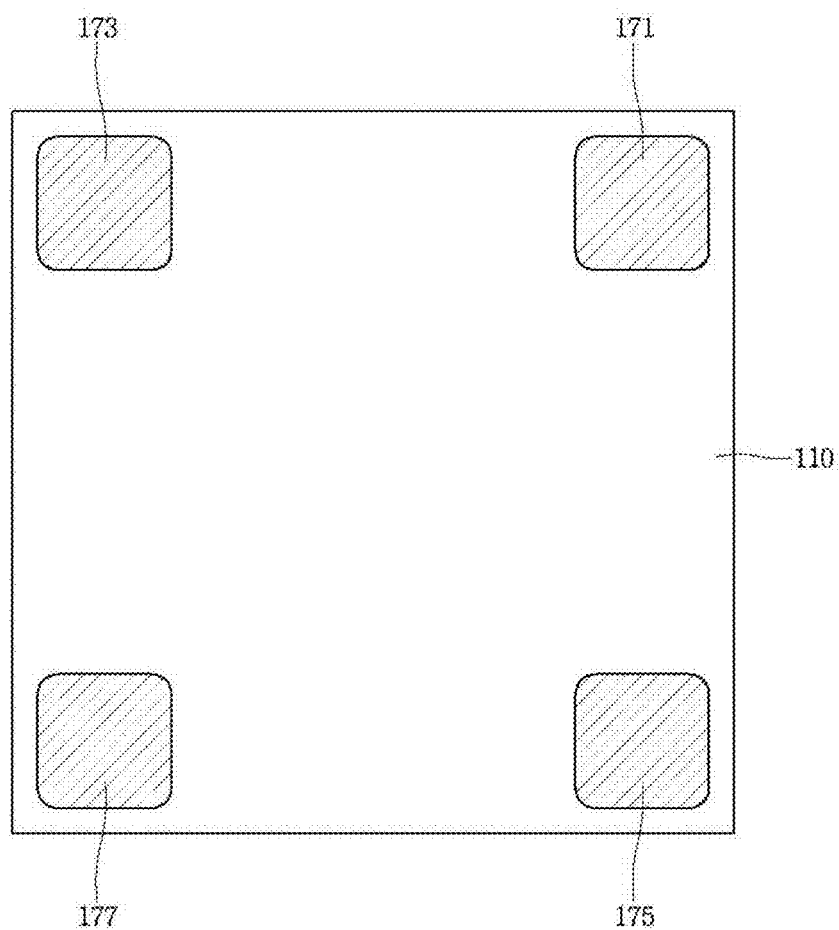
FIG. 5 is a bottom view illustrating the light emitting device of FIG. 2.

FIG. 1 is a perspective view illustrating an example of an outdoor electronic display device according to the embodiment. FIG. 2 is a view illustrating a light emitting device of a display device according to a first embodiment. FIG. 3 is a sectional view taken along line A-A of the light emitting device of FIG. 2. FIG. 4 is a sectional view taken along line B-B of the light emitting device of FIG. 2. FIG. 5 is a bottom view illustrating the light emitting device of FIG. 2.

Referring to FIG. 1, a display device includes a plurality of light emitting devices 2 arranged in a matrix form or a lattice form on a circuit board 1.

The circuit board 1 is electrically connected to the light emitting devices 2 and may control ON/OFF of the light emitting devices 2. The circuit board 1 may include a driving circuit, but the present invention is not limited thereto. The circuit board 1 may include a printed circuit board (PCB) including a resin material, a metal core PCB (MCPCB), a flexible PCB (FPCB), but the present invention is not limited thereto.

The light emitting devices 2 are arranged at specific distances in the horizontal and vertical directions, and characters and images may be displayed by selectively turning on/off the light emitting devices 2. Each light emitting device 2 may include a plurality of light emitting chips and may emit light in multiple colors. The multiple colors may include, for example, a blue color, a green color, and a red color. The light emitting chip may be realized with a light emitting diode (LED) chip. The light emitting device 2 may serve as one light emitting cell.

Such a display device may be an outdoor electronic display device, and may be provided with a housing for moisture-proofing or a light shielding film for shielding light may be installed for the outdoor electronic display device, but the present invention is not limited thereto.

Since the display device is exposed at a distance D1 of several tens of meters or more from a user P, the brightness of each light emitting device 2 and a higher contrast ratio between the light emitting devices 2 are required. As described later, according to the embodiment, the light interference between mutually different light emitting chips in the light emitting device 2 may be reduced, and the contrast ratio between the mutually different light emitting chips may be improved.

FIG. 2 is a view illustrating a light emitting device of a display device according to a first embodiment.

Referring to FIGS. 2 to 4, a light emitting device 120 includes a support substrate 110, light emitting chips 131, 133, and 135 provided on the support substrate 110, and a transmissive resin layer 130 to cover the light emitting chips 131, 133, and 135 on the support substrate. The support substrate 110 may include a plurality of pads 121, 123, 125, and 127 on a top surface thereof. The support substrate 110 may include a black matrix layer 113 on the top surface thereof. The light emitting chips 131, 133, and 135 may be a plurality of LED chips.

The support substrate 110 includes a base layer 111. The base layer 111 may include an insulating material, for example, at least one of a thermosetting resin such as Bismaleimide Triazine (BT), a Composite Epoxy Material (CEM) based resin, a Frame Retardent (FR) based resin, or a ceramic material.

The thickness of the base layer 111 may be thicker than that of any one of the light emitting chips 131, 133, and 135, or may be thicker than that of the thickest light emitting chip. The thickness of the base layer 111 may be in the range of 100 μm or more, for example, 100 μm to 500 μm, for example, 100 μm to 400 μm. If the thickness of the base layer 111 is thicker than the above range, a difficulty may be made when processing a via electrode 161. If the thickness of the base layer 111 is thinner than the above range, a difficulty may be made when handling the base layer 111 and the base layer 111 may have a crack or scratch problem. The base layer 111 may be provided with the thickness described above, thereby supporting the light emitting chips 131, 133, and 135 and preventing the heat radiation efficiency from being lowered.

The pads 121, 123, 125, and 127 are provided on the top surface of the base layer 111 and are spaced apart from each other. The pads 121, 123, 125, and 127 may be physically separated from each other.

The pads 121, 123, 125, and 127 may be formed of metal such as titanium (Ti), copper (Cu), nickel (Ni), gold (Au), chromium (Cr), tantalum (Ta), platinum (Pt), tin (Sn), silver (Ag), phosphor (P), or tungsten (W) or the alloy thereof. The pads 121, 123, 125, and 127 may be formed in a single layer or multiple layers If the pads 121, 123, 125, and 127 are formed in multiple layers, the pads 121, 123, 125, and 127 may include, for example, an adhesive layer, an anti-diffusion layer, and a bonding layer. The adhesive layer may be provided on the base layer 111 and may include at least one of Ti and Cr. The anti-diffusion layer may be provided on the adhesive layer and may include at least one of Ti, W, and Ni. The bonding layer may be provided on the anti-diffusion layer and may include Au or Ag. The thickness of the pads 121, 123, 125, and 127 may be varied depending on the thicknesses of the bonding layer, the anti-diffusion layer, and the bonding layer.

The number of the pads 121, 123, 125, and 127 may be larger than the number of the light emitting chips 131, 133, and 135. For example, the number of the pads 121, 123, 125, and 127 may be one larger than the light emitting chips 131, 133, and 135. The pads 121, 123, 125, and 127 include first to fourth pads 121, 123, 125, and 127. The light emitting chips 131, 133, and 135 may be defined as first to third light emitting chips 131, 133, and 135. The light emitting chips 131, 133, and 135 may be LED chips emitting light in the same color or in different colors.

One or more of the light emitting chips 131, 133, and 135 may be provided on at least one of the first and second pads 121 and 123. The first light emitting chip 131 is provided on the first pad 121 and the second and third light emitting chips 133 and 135 are provided on the second pad 123. The first light emitting chip 131 may be bonded onto the first pad 121 by using an insulation adhesive or a conductive adhesive. The second light emitting chip 133 may be bonded to the second pad 123 by using an insulation adhesive or a conductive adhesive. The third light emitting chip 135 may be bonded onto the second pad 123 by using a conductive adhesive.

The first and second pads 121 and 123 may have an area wider than those of the third and fourth pads 125 and 127, respectively, and may effectively radiate heat emitted from the light emitting chips 131, 133, and 135. The areas of the pads 121, 123, 125, and 127 may be top-surface areas or volumes.

The light emitting chips 131, 133, and 135 may emit light having mutually different peak wavelengths. The first light emitting chip 131 emits first light, the second light emitting chip 133 emits second light, and the third light emitting chip 135 emits third light. The first to third lights may have blue, green, and red wavelengths. For example, the first light may have a blue wavelength, the second light may have a green wavelength, and the third light may have a red wavelength. For another example, the first to third lights may have red, green, and blue wavelengths, respectively, may have green, red, and blue wavelengths, respectively, or may have green, blue, and red wavelengths, but the present invention is not limited thereto. For another example, the light emitting chips 131, 133, and 135 may emit ultraviolet light. In this case, additional color filters (blue/green/red filters) may be provided on relevant light emitting chips.

The second light emitting chip 133 may be disposed between the first light emitting chip 131 and the third light emitting chips 131 and 135. The second light emitting chip 133 may be disposed in the center region. The second light emitting chip 133 may be a chip emitting a green wavelength, or may emit blue or red light wavelengths. However, the present invention is not limited thereto. The visual sensitivity of the center region of the light emitting device 120 is improved when the second light emitting chip 133 emits a green wavelength because the visibility of the green wavelength is higher than that of other blue or red wavelengths.

The first to third light emitting chips 131, 133, and 135 may be aligned in line with each other. For example, the centers of the first to third light emitting chips 131, 133, and 135 may be aligned in line with each other. Accordingly, the interference between lights emitted from mutually different chips 131, 133, and 135 may be minimized. For another example, at least one of the centers of the light emitting chips 131, 133, and 135 may be offset from a straight line. For another example, the shapes of connecting the centers of the first to third light emitting chips 131, 133, and 135 may be in the shape of a triangular or a straight line extending in a vertical direction, or in other shapes, but the present invention are not limited thereto. When the first to third light emitting chips 131, 133, and 135 are arranged in the triangular shape, the color mixture of blue/green/red light may be improved.

The light emitting chip is a semiconductor device having an LED chip, and may include a light receiving device and a protective device, and may include a first conductive semiconductor layer, an active layer, and a second conductive semiconductor layer. The LED chip may be formed of a compound semiconductor of Group II and VI elements or a compound semiconductor of Group III and V elements. For example, the LED chip may selectively include semiconductor devices fabricated using compound semiconductors such as AlInGaN, InGaN, AlGaN, GaN, GaAs, InGaP, AlInGaP, InP and InGaAs. The LED chip may include an n-type semiconductor layer, a p-type semiconductor layer, and an active layer. The active layer may be formed of pairs such as InGaN/GaN, InGaN/AlGaN, InGaN/InGaN, GaN/AlGaN, InAlGaN/InAlGaN, AlGaAs/GaAs, InGaAs/GaAs, InGaP/GaP, AlInGaP/InGaP, or InP/GaAs. The LED chip may be a lateral-type chip, a vertical-type chip, or a flip chip, but the present invention is not limited thereto.

The first pad 121 may be connected to the first to third light emitting chips 131, 133, and 135. The first pad 121 may serve as a common electrode of the first to third light emitting chips 131, 133, and 135. The first pad 121 may be provided a region adjacent to mutually different lateral sides of the support substrate 111. The first pad 121 may have an area twice or more, for example, three times larger than that of the third or fourth pad 125 or 127.

A portion of the second pad 123 may extend to the center of the support substrate 111. The second pad 123 may have an area wider than an area of the first pad 121. The second pad 123 may be provided closer to the fourth pad 127 rather than the third pad 125. The second pad 123 may be electrically connected to the first and second light emitting chips 131 and 133 and may be electrically connected to the third light emitting chip 135.

The third pad 125 may be electrically opened from the light emitting chips 131, 133, and 135 and may be electrically connected to the first light emitting chip 131. The fourth pad 127 may be electrically opened from the light emitting chips 133, 133, and 135 and may be electrically connected to the second light emitting chip 133.

The first light emitting chip 131 may be connected to the first pad 121 and the third pad 125 through connection members 141 and 142. The second light emitting chip 133 may be connected to the first pad 121 and the fourth pad 127 through connection members 143 and 144, and the third light emitting chip 135 may be electrically connected to the second pad 123 and may be connected to the first pad 121 through the connection member 145. The first pad 121 may serve as a common electrode connected to the first to third light emitting chips 131, 133, and 135. The connection members 141, 142, 143, 144, and 145 may include conductive wires, but the present invention is not limited thereto. The first to third light emitting chips 131, 133, and 135 may be individually driven, but the present invention is not limited thereto.

The light emitting chips disclosed in the embodiment may be a lateral-type LED chip in which two electrodes are adjacent to each other, or may be a vertical-type LED chip in which two electrodes are provided in opposite sides. The lateral-type LED chip may employ a plurality of connection members, and the vertical-type LED chip may be connected by employing one or more of the LED chips. The light emitting chips 131, 133, and 135 may have various chip types or may be variously arranged, but the present invention is not limited thereto.

At least portions of the first to fourth pads 121, 123, 125, and 127 may be arranged adjacent to each other in corner regions among lateral sides S1, S2, S3, and S4 of the support substrate 110.

The thickness of each of the pads 121, 123, 125, and 127 may be 1 μm or more. In detail, The thickness of each of the pads 121, 123, 125, and 127 may be in the range of 1 μm to 100 μm. If the thickness is less than the value in the above range, resistance is increased to increase an operating voltage and to emit heat. If the thickness is greater than the value in the above range, the manufacturing cost may be increased. The area of the pads 121, 123, 125, and 127 provided on the support substrate 110 is less than 50% of the top-surface area of the support substrate 110, thereby lowering the light reflectance from the top surface of the support substrate 110. The pads 121, 123, 125, and 127 may be spaced apart from the lateral side of the transmissive resin layer 130 or the edge of the support substrate 110.

The black matrix (BM) layer 113 may be disposed among the pads 121, 123, 125, and 127. The black matrix layer 113 may be provided around each of the pads 121, 123, 125, and 127. Accordingly, on the support substrate 111, regions in which the pads 121, 123, 125, and 127 are provided are exposed, and remaining regions except the regions of the pads 121, 123, 125, and 127 may be regions of the black matrix layer 113. The contrast ratio on the support substrate 110 may be improved due to the black matrix layer 113.

The black matrix layer 113 may be formed of an insulating material such as a black resin. The black matrix layer 113 may be realized with carbon black, graphite, or poly pyrrole. The black matrix layer 113 may be formed of Cr in a single layer structure or a multi-layer structure, but the present invention is not limited thereto. The black matrix layer 113 may be formed of a resin composition into which carbon particles are added.

The black matrix layer 113 may be a light absorbing layer and may be formed of a material representing a reflective index lower than reflective indexes of the pads 121, 123, 125, and 127. The black matrix layer 113 may have a light absorption coefficient higher than light absorption coefficients of the pads 121, 123, 125, and 127. According to the embodiment, the black matrix layer 113 may be formed in a single layer structure or a multi-layer structure.

The thickness of the black matrix layer 113 may be thinner than the thickness of at least one of the light emitting chips 131, 133, and 135 or the thicknesses of all of the light emitting chips 131, 133, and 135. The thickness of the black matrix layer 113 may be 100 μm or less, in detail, in a range of 5 μm to 100 μm. If the thickness of the black matrix layer 113 is less than a value in the above range, the black matrix layer 113 may not perform blackbody radiation, and the uniform thickness of the black matrix layer 113 may not be ensured. Since the pigments of the black matrix layer 113 are provided in powder form, the pigments may not be uniformly applied due to the wetting property of powders if the thickness is less than the value in the above range.

If the thickness of the block matrix layer 113 is thicker than the value in the above range, the heat radiation characteristic of the support substrate 110 may be lowered and the luminous flux of the light emitted through the lateral sides of the light emitting chips 131, 133 and 135 may be affected. The thickness of the block matrix layer 113 may be equal to or thicker than the thicknesses of the pads 121, 123, 125, and 127, but the present invention is not limited thereto. If the thickness of the block matrix layer 113 is thicker than the thicknesses of the pads 121, 123, 125, and 127, the interference between lights emitted from adjacent light emitting chips 131, 133, and 135 may be reduced.

The top-surface area of the black matrix layer 113 may be the area wider than the sum of the top-surface areas of the pads 121, 123, 125, and 127. The black matrix layer 113 may have a material representing a reflective index lower than reflective indexes of the pads 121, 123, 125, and 127 and may be formed in an area of 50% or more of the top-surface area of the support substrate 110. Accordingly, a contrast ratio may be improved around the light emitting chips 131, 133, and 135. The black matrix layer 113 may be formed on the surface thereof with a roughness such as a concavo-convex pattern to control the diffusion of light.

An outer edge of the black matrix layer 113 may be provided under the lateral side of the transmissive resin layer 130. The outer lateral side of the black matrix layer 113 and the lateral sides S1, S2, S3, and S4 of the support substrate 110 may be provided on the same vertical plane. In other words, an outer region of the black matrix layer 113 may extend to an edge of the top surface of the support substrate 110, thereby preventing the surface of the base layer 111 from being exposed. Accordingly, the contrast ratio in the edge region of the support substrate 110 may be improved.

As illustrated in FIGS. 4 and 5, the support substrate 110 includes a plurality of lead electrodes 171, 173, 175, and 177 formed on the bottom surface thereof. The lead electrodes 171, 173, 175, and 177 may be connected to the pads 121, 123, 125, and 127, respectively. At least one of the inside or the lateral side of the support substrate 110 includes a plurality of via electrodes 161. The via electrodes 161 may be electrically connected to the pads 121, 123, 125, and 127 and the lead electrodes 171, 173, 175, and 177. The via electrodes 161 may vertically overlap with the pads 121, 123, 125, and 127 and the lead electrodes 171, 173, 175, and 177. One or more of the via electrodes 161 may be provided under the first and second pads 121 and 123. The plurality of via electrodes 161 may conduct heat generated from the pads 121, 123, 125, and 127 to the lead electrodes 171, 173, 175, and 177, respectively, thereby improving heat radiation efficiency. As illustrated in FIG. 3, the via electrodes 161 may be provided in a region that does not vertically overlap with the light emitting chips 131, 133, and 135.

The lead electrodes 171, 173, 175, and 177 may be provided adjacent to corner regions of the support substrate 110, respectively. A lower black matrix layer may be provided on the bottom surface of the base layer 111. The lower black matrix layer may be provided in a remaining region except the lead electrodes 171, 173, 175, and 177, but the present invention is not limited thereto. For another example, the lead electrodes 171 and 173, which are connected to the first and second pads 121 and 123, among the lead electrodes 171, 173, 175, and 175 may have areas wider than areas of remaining lead electrodes. In this case, the heat radiation efficiency of the first and second pads 121 and 123 may be improved.

The transmissive resin layer 130 is provided on the support substrate 110. The transmissive resin layer 130 covers the pads 121, 123, 125 and 127, the light emitting chips 131, 133 and 135, and the block matrix layer 113. The top surface of the transmissive resin layer 130 may be provided at a position higher than the highest point of the connection members 141, 142, 143, 144, 145, but the present invention is not limited thereto. The surface of the transmissive resin layer 130 may include a roughness such as a concavo-convex pattern, and the roughness may reduce external irregular reflection. The transmissive resin layer 130 may be formed of a material such as silicon or epoxy, but the present invention is not limited thereto. The transmissive resin layer 130 may be transparent resin having no impurities. The impurities may be particles having a refractive index higher than a refractive index of the transparent resin.

According to the embodiment, when viewed from the transmissive resin layer 130 to the support substrate 111, the black matrix layer 113 having a large area is provided in remaining regions except regions of the pads 121, 123, 125, and 127. Accordingly, the black matrix layer 113 absorbs external light incident thereto through the transmissive resin layer 130 without reflecting the light. Accordingly, the contrast ratio of the light emitting device 120 may be improved.

Figure 6:
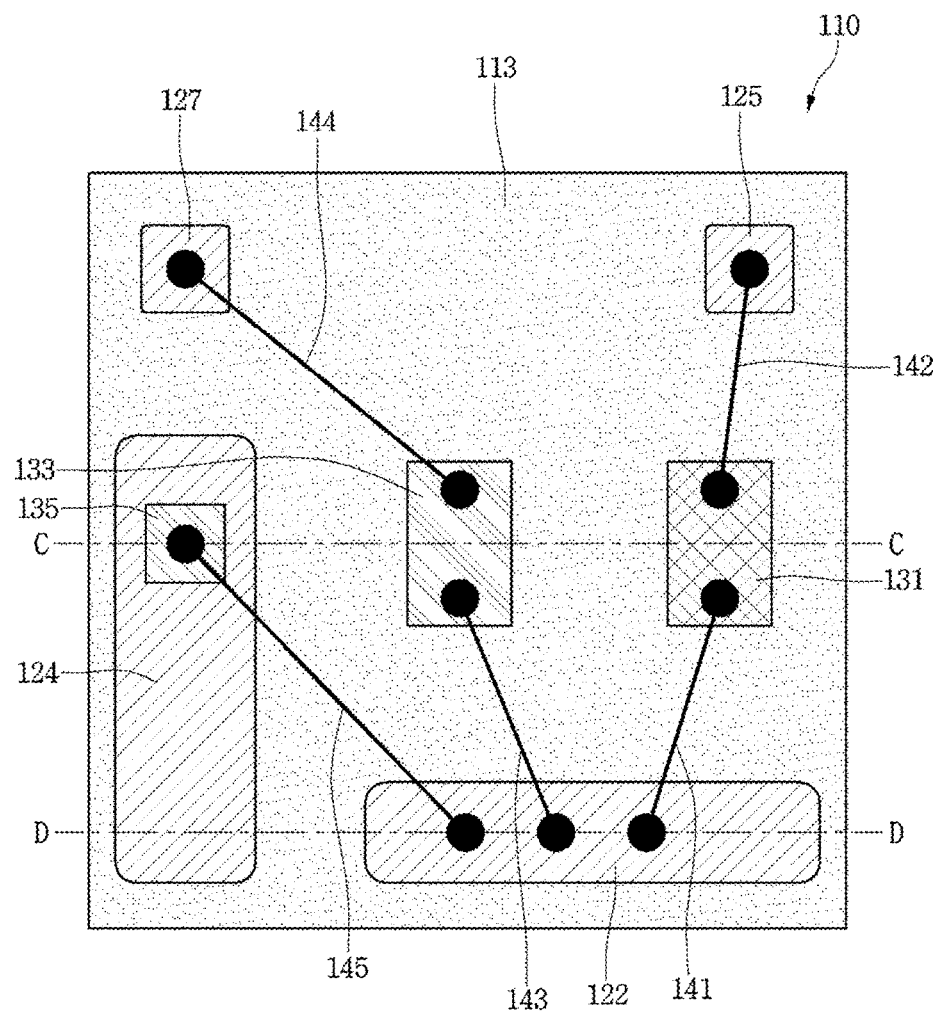
FIG. 6 is a view illustrating a light emitting device of a display device according to a second embodiment.
Figure 7:
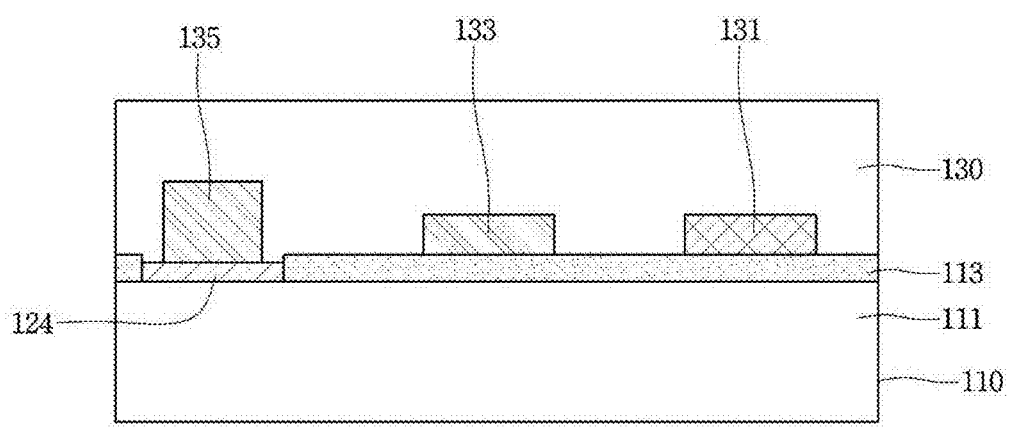
FIG. 7 is a sectional view taken along line C-C of the light emitting device of FIG. 6.
Figure 8:
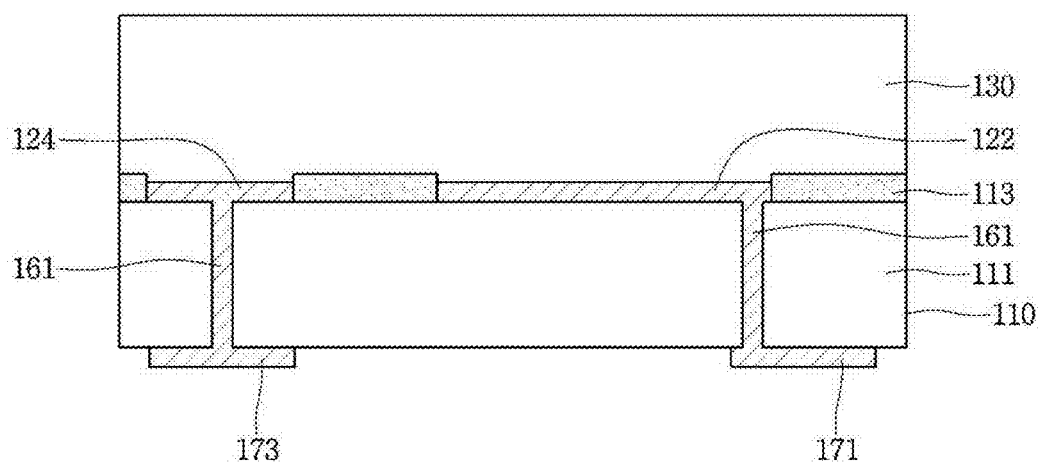
FIG. 8 is a sectional view taken along line D-D of the light emitting device of FIG. 6.

FIGS. 6 to 8 are views illustrating light emitting devices of display devices according to a second embodiment. In the following description of the second embodiment, the same parts as those of the first embodiment will be understood with the reference to the description of the first embodiment.

Referring to FIGS. 6 to 8, a light emitting device includes a support substrate 110 having a plurality of pads 122, 124, 125, and 127 and a black matrix layer 113, a plurality of light emitting chips 131, 133, and 135, at least one of the light emitting chips 131, 133, and 135 which is provided on at least one of the pads 122, 124, 125, and 127, and a transmissive resin layer 130 on the support substrate 110.

The pads 122, 124, 125, and 127 may include first to fourth pads 122, 124, 125, and 127 provided on the base layer 111, and the first to fourth pads 122, 124, 125, and 127 may be spaced apart from each other.

The light emitting chips 131, 133, and 135 may include first to third light emitting chips 131, 133, and 135, any one of the first to third light emitting chips 131, 133, and 135 may be provided on the pad 124, and the remaining light emitting chips 131 and 133 may be provided on the black matrix layer 113. For example, the third light emitting chip 135 may be provided on the second pad 124. The third light emitting chip 135 may represent the highest heat value among the light emitting chips 131, 133, and 135.

At least one light emitting chip 135 may be provided on any one 124 of the first to fourth pads 122, 124, 125, and 127 and remaining pads 122, 125, and 127 may be spaced apart from the light emitting chips 131, 133, and 135. The first, third, and fourth pads 122, 125, and 127 may be connected to the light emitting chips 131, 133, and 135 through connection members 141, 14, 143, 144, and 145. For example, the third light emitting chip 135 may be provided on the second pad 124 of the first to fourth pads 122, 124, 125, and 127 and the first, third, and fourth pads 122, 125, and 127 may be spaced apart from the light emitting chips 131, 133, and 135. The connection members 141, 142, 143, 144 and 145 may connect the light emitting chips 131, 133 and 135 to the first, third and fourth pads 122, 125 and 127.

At least two light emitting chips 131 and 133 of the light emitting chips 131, 133 and 135 may be spaced apart from the pads 122, 124, 125 and 127 and may not overlap with the pads 122, 124, 125 and 127 in the vertical direction. The at least two light emitting chips 131 and 133 may be a blue LED chip and a green LED chip. The second light emitting chip 133 at the center of the light emitting chips 131, 133, and 135 may be provided on the black matrix layer 113. Accordingly, the contrast ratio on the central region of the light emitting device may be improved. The second light emitting chip 133 may be a chip emitting a green wavelength, or may emit blue or red wavelengths. However, the present invention is not limited thereto. When the second light emitting chip 133 emits light having a green wavelength, the visual sensitivity of the green wavelength is higher than the visual sensitivity of a blue or red wavelength, so the visual sensitivity may be improved at the center region of the light emitting device.

The first light emitting chip 131 is provided on the black matrix layer 113 provided on the base layer 111 and the second light emitting chip 133 is provided on the black matrix layer 113 provided on the base layer 111. For example, the third light emitting chip 135 may be provided on the second pad 124. The first light emitting chip 131 may be bonded to the black matrix layer 113 with an insulating or conductive adhesive. The second light emitting chip 131 may be a blue LED chip.

The second light emitting chip 133 may be bonded onto the black matrix layer 113 by using an insulating or conductive adhesive and may be disposed between the first and third light emitting chips. The second light emitting chip 133 may be a green LED chip. When the second light emitting chip 133 emits light having a green wavelength, the visual sensitivity of the green wavelength is higher than the visual sensitivity of a blue or red wavelength, so the visual sensitivity may be improved at the center region of the light emitting device.

The third light emitting chip 135 may be a red LED chip to emit light having a red wave length. The third light emitting chip 135 may be provided on the second pad 124 to solve the heat radiation problem. The area of the second pad 124 may be wider than areas of the first, third, and fourth pads 122, 125, and 127.

For another example, the first to third light emitting chips 131, 133, and 135 may emit light having red, green, and blue wavelengths, respectively, may emit light having green, red, or blue wavelengths, or may emit light having green, blue, or red wavelengths. The present invention is not limited thereto. For another example, the light emitting chips 131, 133, and 135 may emit ultraviolet light. In this case, additional color filters (blue/green/red filters) may be provided on relevant light emitting chips.

The first to third light emitting chips 131, 133, and 135 may be aligned in line with each other. For example, the centers of the first to third light emitting chips 131, 133, and 135 may be arranged on the same straight line. For another example, at least one of the centers of the light emitting chips 131, 133, and 135 may be offset from a straight line. For another example, the shapes of connecting the centers of the first to third light emitting chips 131, 133, and 135 may be in the shape of a triangular or a straight line extending in a vertical direction, or in other shapes, but the present invention are not limited thereto. When the first to third light emitting chips 131, 133, and 135 are arranged in the triangular shape, the color mixture of blue/green/red light may be improved.

According to the second embodiment, the pads (portions of the pads 121 and 123 of FIG. 2) provided under at least two light emitting chips (131 and 133 of FIG. 2) of the light emitting chips 131, 133, and 135 are removed, so the area of the black matrix layer 113 may be increased. In other words, the area of the black matrix layer 113 may be 150% or more than the sum of the areas of the pads 122, 124, 125, and 127. The area of the black matrix layer 113 is increased to more improve the contrast ratio as compared with the first embodiment.

Figure 9:
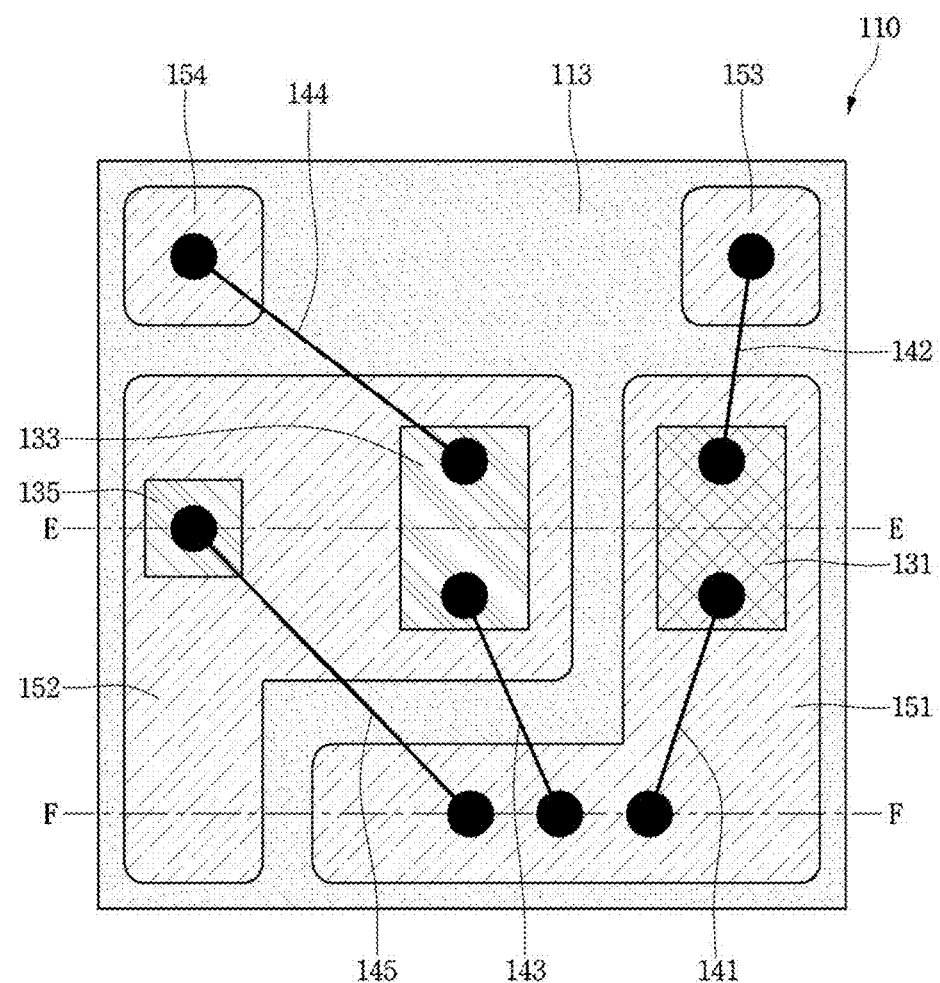
FIG. 9 is a plan view illustrating a light emitting device of a display device according to a third embodiment.
Figure 10:
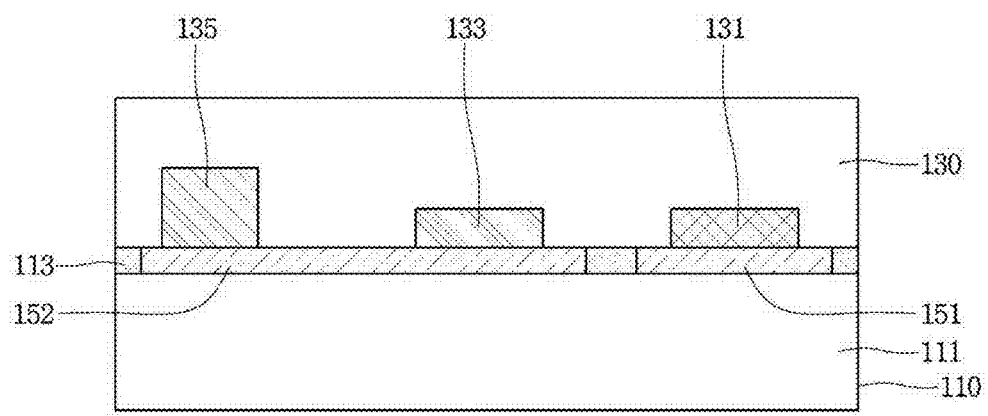
FIG. 10 is a sectional view taken along line E-E of the light emitting device of FIG. 9.
Figure 11:
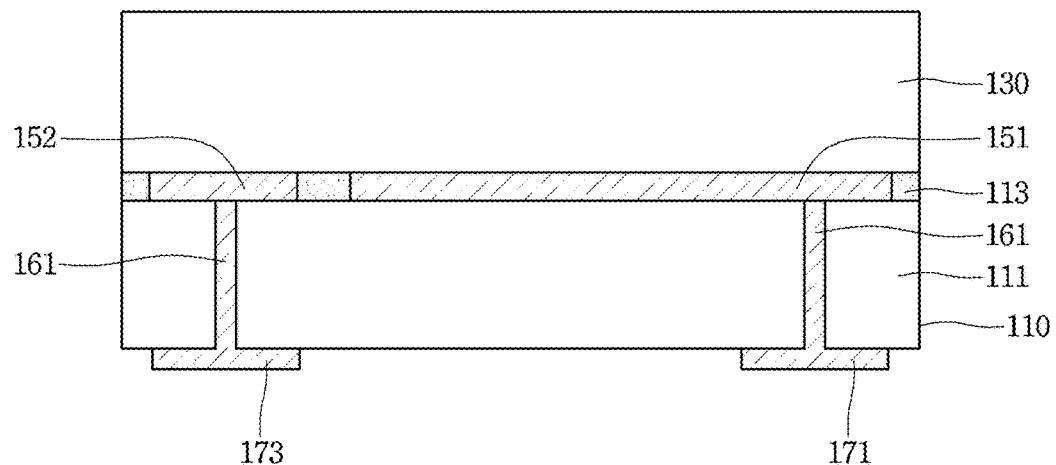
FIG. 11 is a sectional view taken along line F-F of the light emitting device of FIG. 9.

FIGS. 9 to 11 are views illustrating light emitting devices of display devices according to a third embodiment. In the following description of the third embodiment, the same parts as those of the first and second embodiments will be understood through the reference to the description of the first and second embodiments.

Referring to FIGS. 9 to 11, a light emitting device includes a support substrate 110 having a plurality of pads 151, 152, 153, and 154 and a black matrix layer 113, a plurality of light emitting chips 131, 133, and 135, at least one of the light emitting chips 131, 133, and 135 which is provided on at least one of the pads 151, 152, 153, and 154, and a transmissive resin layer 130 on the support substrate 110.

The pads 151, 152, 153, and 154 may include first to fourth pads 151, 152, 153, and 154 provided on the base layer 111, and the first to fourth pads 151, 152, 153, and 154 may be spaced apart from each other.

At least one, two or more, or all of the first to fourth pads 151, 152, 153 and 154 may be formed of carbon black materials. The carbon black may include at least one of lamp black, channel black, thermal black, acetylene black, and furnace black. The pads 151, 152, 153 and 154 formed of the carbon black material may have conductivity and may be electrically connected to the light emitting chips 131, 133 and 135 or the connection members 141, 142, 143, 144 and 145.

As illustrated in FIG. 10, the first light emitting chip 131 is provided on the first pad 151 and the second and third light emitting chips 133 and 135 are provided on the second pad 152. The first light emitting chip 131 may be bonded onto the first pad 151 with an insulating or conductive adhesive. The second light emitting chip 133 may be bonded onto the second pad 152 with an insulating or conductive adhesive. The third light emitting chip 135 may be bonded onto the second pad 152 by using a conductive adhesive.

The first light emitting chip 131 may be connected to the first pad 151 and the third pad 153 through the connection members 141 and 142. The second light emitting chips 133 and 135 may be connected to the first pad 151 and the fourth pad 154 through connection members 143 and 144. The third light emitting chip 133 may be electrically connected to the second pad 152 and may be connected to the first pad 151 through a connection member 145. Since the first to fourth pads 151, 152, 153 and 154 are formed of a conductive carbon black material, the top-surface region of the supporting substrate 110 is processed as a black region except for the first to third light emitting chips 131, 133 and 135. The light emitting chips disclosed in the embodiment may be a lateral-type LED chip in which two electrodes are adjacent to each other, or may be a vertical-type LED chip in which two electrodes are provided in opposite sides. The lateral-type LED chip may employ a plurality of connection members, and the vertical-type LED chip may be connected by employing one or a plurality of LED chips. The light emitting chips 131, 133, and 135 may have various chip types or may be variously arranged, but the present invention is not limited thereto.

The thickness of the pads 151, 152, 153, and 154 formed of the carbon black material may be thinner than the thickness of at least one of the light emitting chips 131, 133, and 135 or the thicknesses of all of the light emitting chips 131, 133, and 135. The thicknesses of the pads 151, 152, 153, and 154 formed of the carbon black material may be the same as the thickness of the black matrix layer 113. The thickness of the pads 151, 152, 153, and 154 formed of the carbon black material may be 100 μm or less, in detail, in a range of 5 μm to 100 μm. If the thicknesses of the pads 151, 152, 153, and 154 are less than a value in the above range, the black matrix layer 113 may not perform blackbody radiation, and the uniform thickness of the black matrix layer 113 may not be ensured. Since the pigments of the black matrix layer 151, 152, 153, and 154 are provided in powder form, the pigments may not be uniformly applied due to the wetting property of powders if the thickness is less than the value in the above range.

If the thicknesses of the pads 151, 152, 153, and 154 formed of a carbon black material are thicker than the value in the above range, the heat radiation characteristic of the support substrate 110 may be lowered and the luminous flux of the light emitted through the lateral sides of the light emitting chips 131, 133 and 135 may be affected. The thicknesses of the pads 151, 152, 153, and 154 formed of a carbon black material may be equal to or thicker than the thicknesses of the pads 121, 123, 125, and 127, but the present invention is not limited thereto. If the thicknesses of the pads 151, 152, 153, and 154 formed of a carbon black material are thicker than the thicknesses of the pads 121, 123, 125, and 127, the interference between lights emitted from adjacent light emitting chips 131, 133, and 135 may be reduced.

Since the pads 151, 152, 153, and 154 are formed in black, even if the sum of the areas of the pads 151, 152, 153 and 154 are increased when compared with those of the first embodiment, the pads 151, 152, 153, and 154 do not degrade the contrast ratio. The sum of the areas of the pads 151, 152, 153 and 154 on the support substrate 110 may be in the range of 50% to 65% of a top-surface area of the support substrate 110. The area of the black matrix layer 113 may be in the range of 35% to 50% of the top-surface area of the support substrate 110. The areas of the pads 151, 152, 153 and 154 may be more widened to improve the heat radiation efficiency and prevent the contrast ratio from decreasing.

Although description has been made regarding that all of the pads 151, 152, 153 and 154 are formed in conductive carbon black, at least one or two of the pads 151, 152, 153, and 154 are formed in carbon black and remaining pads may be metal pads. For example, the first and second pads 151 and 152 may formed in conductive carbon black, and the third and fourth pads 153 and 154 may be formed in the form of metal pads instead of carbon black pads. In contrast, the first and second pads 151 and 152 may be formed in the form as metal pads, and the third and fourth pads 153 and 154 may be formed as conductive carbon black pads.

The via electrode 161 in the support substrate 110 may be connected to the pads 151, 152, 153, and 154 formed of a carbon black material, or may connect the pads 151, 152, 153, and 154 to the lead electrode as illustrated in FIG. 5.

Figure 12:
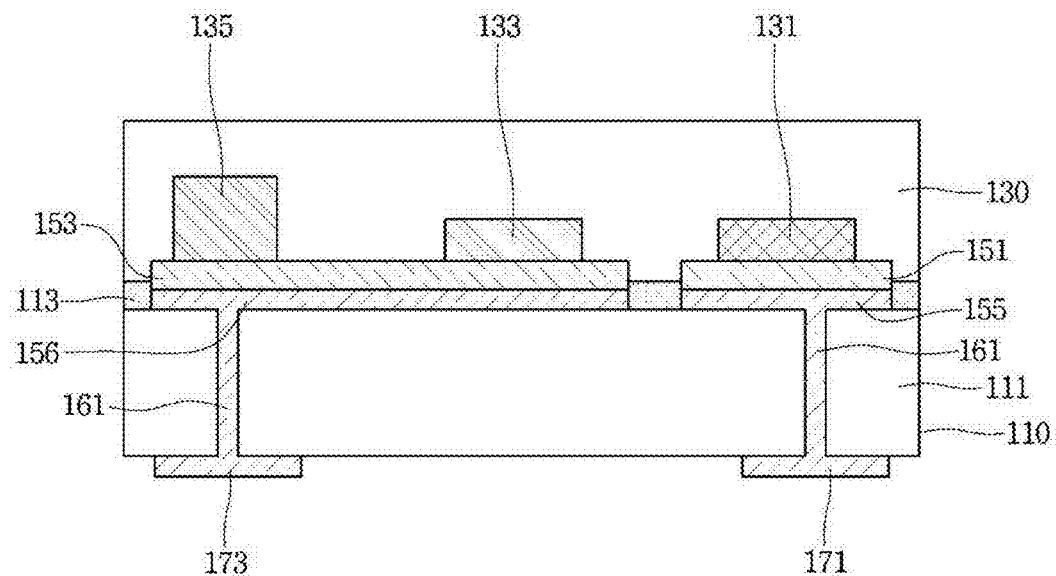
FIG. 12 is another example of the light emitting device of FIG. 10.

As illustrated in FIGS. 9 and 12, in the case of at least one, two, or all of the pads 151, 152, 153, and 154, metal layers 155 and 156 may be provided under the pads 151 and 152. In other words, the metal layers may be metal pads disclosed in the first embodiment. Since the first to third light emitting chips 131, 133, and 135 may be provided on the lamination structure of the first and second pads 151 and 152 formed in carbon black and the metal layers 155 and 156, the heat radiation efficiency may be improved. The metal layer may be provided even under the third and fourth pads 153 and 154, but the present invention is not limited thereto.

One, at least two, or all of the pads 151, 152, 153, and 154 may be in the lamination structure of a carbon black pad/a metal pad. In addition, the metal pad may be formed in a single layer or multiple layers as described in the first embodiment, but the present invention is not limited thereto.

Figure 13:
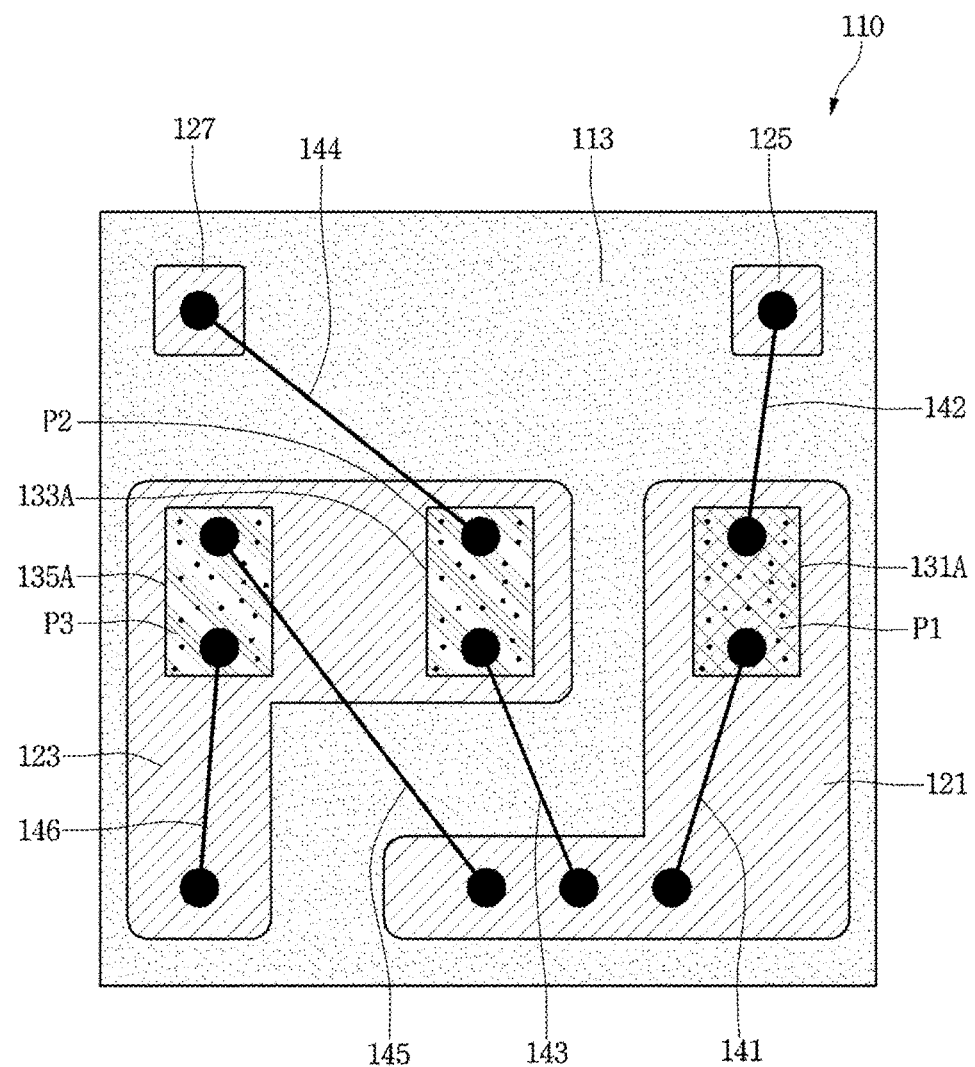
FIG. 13 is a plan view illustrating a light emitting device of a display device according to a fourth embodiment.

FIG. 13 is a plan view illustrating a light emitting device of a display device according to a fourth embodiment. In the following description of the fourth embodiment, the same elements as those illustrated in FIGS. 2 to 4 in the first embodiment will be understood based on the description made with reference to FIGS. 2 to 4.

1 Referring to FIG. 13, the light emitting device includes a support substrate 110 having a plurality of pads 121, 123, 125, and 127 on a support substrate 110 and a black matrix layer 113 around the plurality of pads 121, 123, 125, and 127, a plurality of light emitting chips 131A, 133A, and 135A, at least one of the light emitting chips 131A, 133A, and 135A which is provided on at least one of the pads 121, 123, 125, and 127, phosphor layers P1, P2, and P3 arranged on the light emitting chips 131A, 133A, and 135A, or a transmissive resin layer (see reference numeral 130 in FIG. 3) on the support substrate 110.

The light emitting chips 131A, 133A, and 135A include first to third light emitting chips 131A, 133A, and 135A to emit light having an ultraviolet wavelength, and the phosphor layers P1, P2, and P3 include first to third phosphor layers P1, P2, and P3 that emit light having mutually different peak wavelengths. The first phosphor layer P1 is provided on the first light emitting chip 131A, the second phosphor layer P2 is provided on the second light emitting chip 133A, and the third phosphor layer P3 may be provided on the third phosphor layer P3. The first phosphor layer P1 converts the ultraviolet into light having a blue wavelength and emits the converted light. The second phosphor layer P2 converts the ultraviolet light into light having a green wavelength. The third phosphor layer P3 converts the ultraviolet light into a light having a red wavelength and emits the converted light. Accordingly, the light emitting device may emit multi-color lights, the light emitting chips 131A, 133A, and 135A may be individually driven.

The phosphor layers P1, P2, and P3 may be formed on the top surfaces or the top surfaces/lateral sides of the light emitting chips 131A, 133A, and 135A, respectively, but the present invention is not limited thereto.

For another example, the first and second light emitting chips 131A and 133A of the first to third light emitting chips 131A, 133A, and 135A are blue and green LED chips, respectively. The third light emitting chip 135A is an ultraviolet LED chip and the phosphor layer P3 may be formed on the surface thereof. This refers to that at least one or two of the first to third light emitting chips 131A, 133A, and 135A may be colored LED chips (for example, blue color, green color, or red color) having no phosphor layers or may be ultraviolet LED chips having a phosphor layer formed thereon.

For another example, the light emitting chips 131A, 133A, and 135A emit light having the same peak wavelength, for example, a blue peak wavelength, and the phosphor layers P1, P2, and P3 may include yellow phosphors. Green, blue, and red color filters are provided on the light emitting devices to adjust the light emitting device to light in a desired color with respect to white color obtained by mixing blue color light and yellow color light emitted from the light emitting devices by using the color filters.

Figure 14:
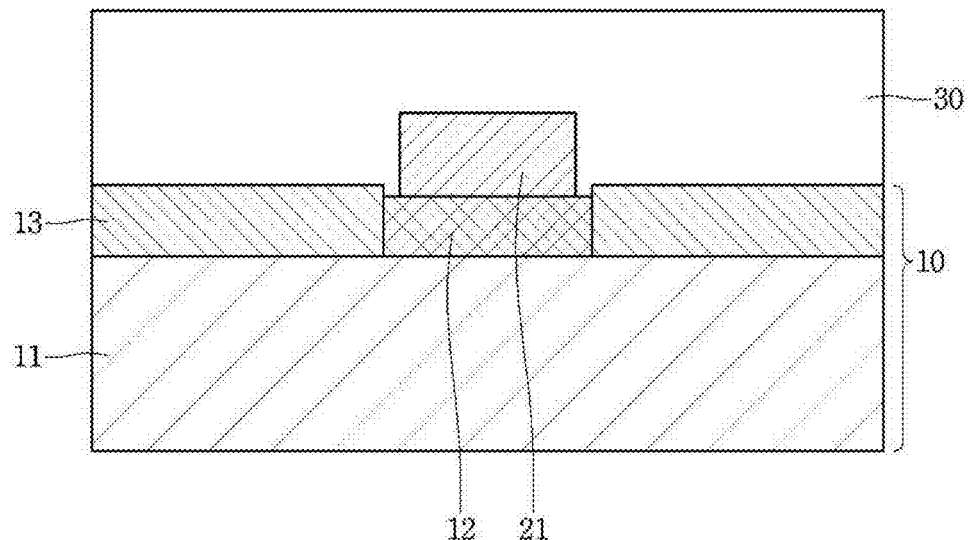

FIG. 14 is a view illustrating a support substrate of the light emitting device, according to the embodiment.

Referring to FIG. 14, a black matrix layer 13 provided on a support substrate 10 makes contact with the lateral side of a pad 12 to surround the pad 12. The thickness of the black matrix layer 13 may be thicker than the thickness of the pad 12.

The transmissive resin layer 130 may be provided on the light emitting chip 21, the pad 12, and the black matrix layer 13. The pad 12 may be formed of a metal material or a carbon black material, but the present is not limited thereto.

The outer surface of the black matrix layer 13 may be provided on the same vertical plane as the outer surface of the support substrate 10, thereby preventing moisture from being infiltrated into the interfacial surface between the black matrix layer 13 and the transparent resin layer 130.

The via electrode 161 (see FIG. 4) connected to the pad 12 may be connected to the inside or the outside of the base layer 11 of the support substrate 10. As illustrated in FIGS. 4 and 5, the via electrode 161 may be electrically connected to the lead electrodes 171, 173, 175, and 177 provided under the base layer 11, but the present invention is not limited thereto.

Figure 15:
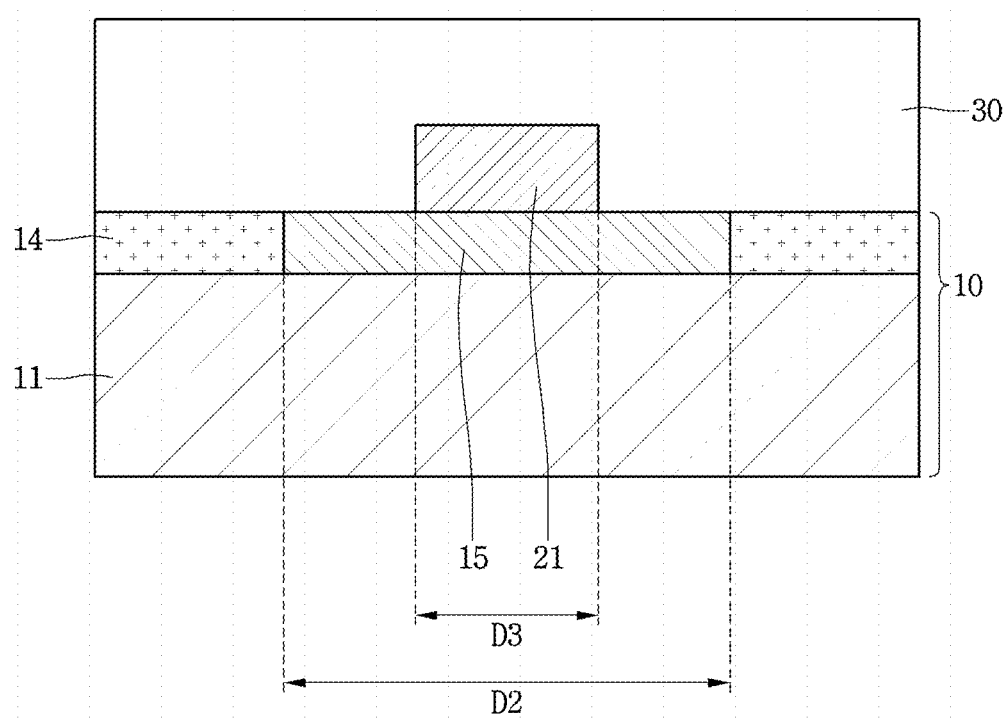
FIG. 15 is a view illustrating an example of a support substrate of a light emitting device according to the embodiment.

FIG. 15 is a view illustrating another example of a support substrate of a light emitting device, according to the embodiment.

Referring to FIG. 15, in the light emitting device, a black matrix layer 14 may be provided around a pad 15 on the support substrate 10. The pad 15 may be formed of a conductive carbon black material. The width D2 of the pad 15 may be wider than the width D3 of a light emitting chip 21, thereby effectively radiating heat emitted from the light emitting chip 21. The thickness of the pad 15 may be identical to or different from the thickness of the black matrix layer 13.

Since the pad 15 and the black matrix layer 14 have the same black color, the contrast ratio on the surface of the light emitting device may be improved on the surface of the light emitting device.

The via electrode 161 (see FIG. 4) connected to the pad 12 may be connected to the inside or the outside of the base layer 11 of the support substrate 10. As illustrated in FIGS. 4 and 5, the via electrode 161 may be electrically connected to the lead electrodes 171, 173, 175, and 177 provided under the base layer 11, but the present invention is not limited thereto.

Figure 16:
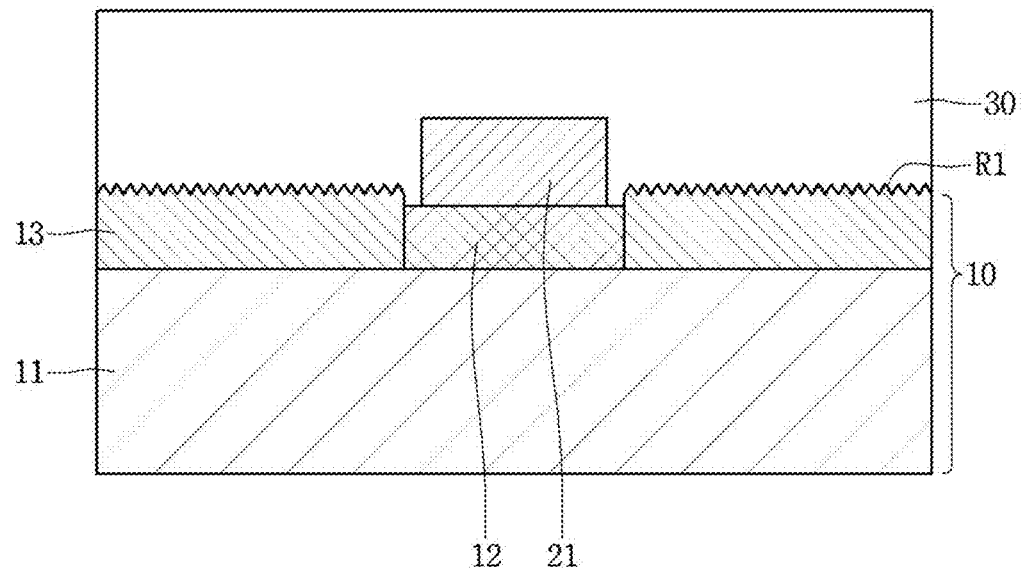
FIG. 16 is a view illustrating another example of a support substrate of a light emitting device according to the embodiment.

Referring to FIG. 16, the light emitting device is another example of the light emitting device of FIG. 12. Referring to FIG. 16, a roughness R1 such as a concavo-convex pattern may be formed on a black matrix layer 13 on the support substrate 110 of the light emitting device.

The black matrix layer 13 may be formed of a resin composition having carbon particles, and may be formed of an insulating material according to the amount of the carbon particles. The roughness R1 may be formed on the top surface of the black matrix layer 13. The size of the roughness R1, for example, the height or the width of the roughness R1 is 10 nm or more, for example, in the range of 10 nm to 50 nm, in more detail, in the range of 10 nm to 30 nm. If the size of the roughness R1 is less than 10 nm, the light shielding property may be lowered and the diffusivity of light may be increased. If the size of the roughness R1 exceeds 50 nm, the light shielding property may be reduced, and sinking may be easily caused.

Figure 17:
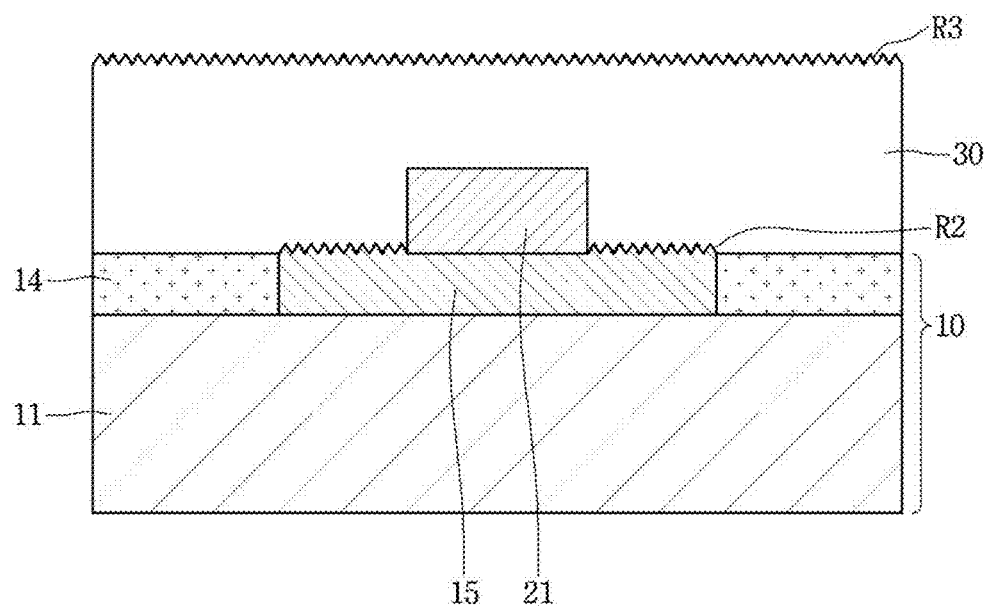
FIG. 17 is a view illustrating a roughness provided in a light emitting device according to the embodiment.

Referring to FIG. 17, in the light emitting device, roughness R2 and roughness R3 are formed on the surface of the pad 15 formed of a carbon black material and the surface of the transmissive resin layer 30 The roughness R2 provided on the surface of the pad 15 may improve the light shielding property and prevent the diffusion of the light. The roughness R3 provided on the surface of the transmissive resin layer 30 may prevent the diffused reflection of the light.

Figure 18:
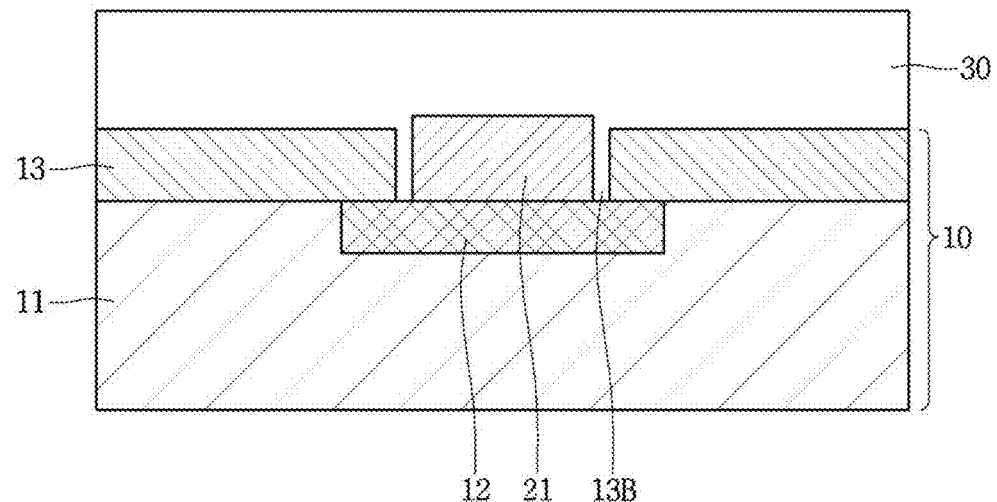
FIG. 18 is a view illustrating another example of a light emitting device according to the embodiment.

FIG. 18 is a view illustrating another example of a light emitting device according to the embodiment. In the following description made with reference to FIG. 18, the same parts as those described above will be understood with reference to the above-disclosed description.

Referring to FIG. 18, the light emitting device includes a pad 12 provided below the top surface of the base layer 11, a light emitting chip 21 provided on the pad 12, and a black matrix layer 13 provided around the black matrix layer 13. The transmissive resin layer 30 may be provided on the black matrix layer 13 and the light emitting chip 21.

The light emitted from the light emitting chip 21 may be emitted through the transmissive resin layer 30 and the light, which is emitted to the black matrix layer 13, of the light emitted to the side of the light emitting chip 21 may be absorbed. The light emitted to the transmissive resin layer 30 may be emitted to the outside.

The light emitting chip 21 may be a vertical-type LED chip structure in which most of light is emitted from the top surface thereof. In the case of the vertical-type LED chip structure, a reflective layer formed of a metal material is provided under the semiconductor layer to reflect light to the top surface of the semiconductor layer. Accordingly, light loss may be reduced due to the black matrix layer 13.

For another example, a reflective layer formed of a resin material may be further provided in a region 13B between the light emitting chip 21 and the black matrix layer 13. The reflective layer formed of the resin material may reflect light emitted to the lateral side of the light emitting chip 21, thereby reducing light loss.

Figure 19:
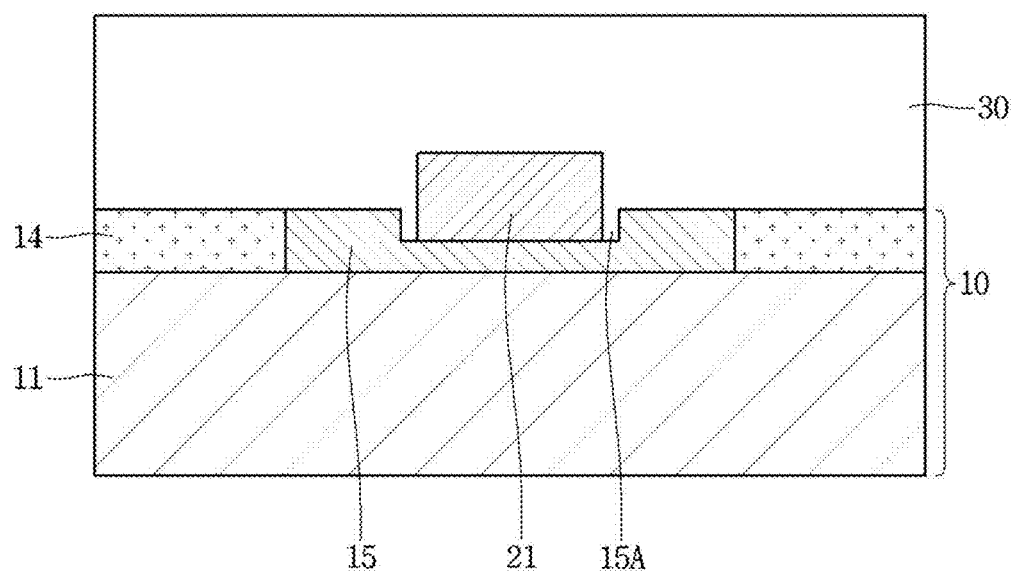
FIG. 19 is a view illustrating still another example of a light emitting device according to the embodiment.

FIG. 19 is a view illustrating still another example of a light emitting device according to the embodiment. In the following description made with reference to FIG. 19, the same parts as those described above will be understood with reference to the above-disclosed description.

Referring to FIG. 19, the light emitting device has a recess part 15A provided in a pad 15 on a base layer 11, and a light emitting chip 21 is provided in the recess part 15A. A black matrix layer 14 may be provided around the pad 15. The pad 15 may be formed of a carbon black material, may be formed in a laminated structure of a carbon black layer/a metal layer, or may be formed of a metal pad.

Since the light emitting chip 21 is provided in the recess part 15A, the light emitted to the side surface of the light emitting chip 21 may be reflected by the circumferential surface of the recess part 15A. Accordingly, light loss may be reduced and the diffusion of the light may be lowered.

The light emitting device according to the embodiment may emit light in a blue color, a green color, and a red color. Accordingly, the light emitting device may serve as a unit pixel. When such unit pixels are arranged in plural, the unit pixels can be realized as display modules of a display device.

Figure 20:
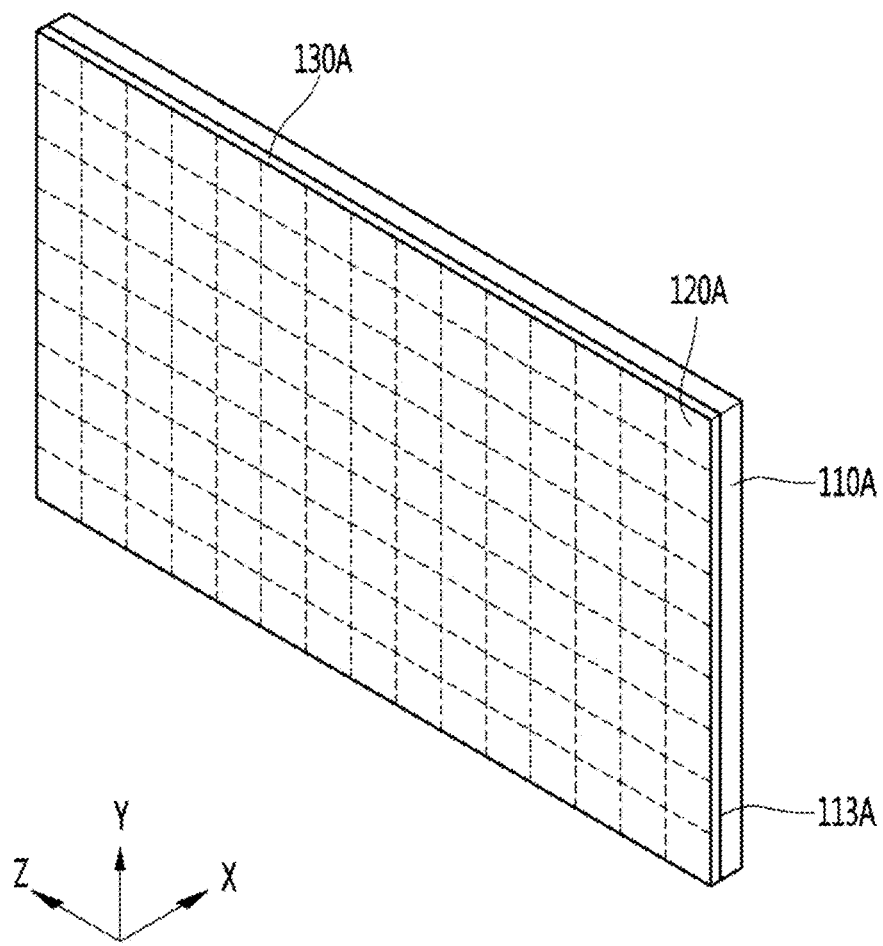
FIG. 20 illustrates an example of a display module or a display device having the light emitting device according to the embodiment.

FIG. 20 is a perspective view illustrating a display module in which light emitting devices are arranged according to the embodiment.

Referring to FIG. 20, the display module may have a unit pixel region 120A having a light emitting region arranged in a matrix form on a support substrate 110A. Each of the pixel regions 120A may be realized by a light emitting device according to an embodiment (see reference numeral 120 of FIG. 2), and may be a region capable of emitting light in different colors. The mutually different colors include red, green, and blue colors. In the size of the pixel region 120A, the length of one side may be 0.8 mm or more, for example, may be in the range of 0.8 mm to 10 mm. In addition, the length of the side may be in the range of 0.8 mm to 1.6 mm due to the LED chip. In this case, the pixel region 120A is arranged on the support substrate 110A, and the entire region of the pixel region 120A may be protected by the transmissive resin layer 130A. A black matrix layer 113A is disposed between the transparent resin layer 130A and the support substrate 110A and may be exposed to the outside, but the present invention is not limited thereto. A black matrix may be provided at the boundary between the pixel regions 120A, but the present invention is not limited thereto. A plurality of driver ICs may be arranged on the rear surface of the support substrate 110A, and the driver IC may control driving and current of the light emitting devices.

The display module may be realized as a unit display panel. The embodiment is implemented with a light emitting device having an LED chip in the unit pixel region 120A, thereby minimizing the pitch between the pixels. For example, the display module may be realized with an Standard Definition (SD) resolution (760480), a high definition (HD) resolution 1180720, a full HD (FHD) resolution (Ser. No. 19/201,080), a ultra HD (UH) resolution (34802160), Or a UHD resolution or higher (for example, 4K (K=1000), 8K, or the like). 4K (K=1000), 8K, or the like). As such a display module is realized with a pixel having an LED, power consumption may be reduced, may be provided with a long lifetime at a low maintenance cost, and may be provided as a high-brightness and self-emissive display.

According to the embodiment, a plurality of light emitting devices may be arranged on a substrate, and an optical member, such as a lens, a light guide plate, a prism sheet, a diffusion sheet, or the like may be provided on the light path of the light emitting device. The light emitting element, the substrate, and the optical member may be applied to a lighting device or a light unit. The light emitting device may be realized in the form of a top-view light unit, a side-view light unit, or a light emitting module, and may be provided in a display device such as a portable terminal and a notebook computer. The light emitting device may be variously applied to various lighting devices or indicator devices.

According to another embodiment, a lighting device including the light emitting devices disclosed in the above-described embodiments may be realized. For example, the lighting device may include a lamp, a streetlight, an electric signboard, and a headlight. Further, the lighting device according to the embodiment can be applied to a tail lamp as well as a vehicle headlight.

Features, structures, effects, or the like described in the above embodiments are included at least one embodiment of the present invention, but is not limited to only one embodiment. Further, the feature, the structure, or the effect illustrated in each embodiment can be combined or modified in relation to other embodiments by those skilled in the art to which the embodiments pertain. Accordingly, such combination and modification should be interpreted as falling within the scope of the present invention.

Although the above description has been made while focusing on the embodiments for the illustrative purpose, the present invention is not limited thereto, and it should be understood that numerous other modifications and applications can be devised by those skilled in the art. For example, each element described in detail can be modified and applied. However, modifications and applications of the elements should be interpreted as falling within the scope of the present invention.

INDUSTRIAL APPLICABILITY

The embodiment can provide the light emitting device representing the higher contrast ratio.

The embodiment can improve the contrast ratio of the display device having a plurality of light emitting devices.

The embodiment can provide an outdoor electric display device having a light emitting device representing a higher contrast ratio.

The embodiment can improve the reliability of the light emitting device and the display device including the light emitting device.

According to the embodiment, the light emitting device may be applied to a lighting device such as an illumination lamp, an indicator lamp, a vehicle lamp, or a backlight unit.

The invention claimed is:

1. A light emitting device comprising:
a support substrate having a plurality of pads on a top surface thereof and a black matrix layer on an outer side of the pads;
a plurality of light emitting chips electrically connected to the pads, wherein at least one of the light emitting chips is provided on at least one of the pads; and
a transmissive resin layer provided on the support substrate to cover the pads, the black matrix layer, and the light emitting chips,
wherein the black matrix layer is disposed between the plurality of pads, and
wherein the black matrix layer is disposed around each of the plurality of pads,
wherein an area of a pad on which a light emitting chip is disposed is larger than an area of another pad among the plurality pads, and
wherein the another pad is disposed where the light emitting chips is not disposed.

2. The light emitting device of claim 1, wherein the pads are formed of a metal material, and
wherein at least two of the light emitting chips are provided on the black matrix layer.

3. The light emitting device of claim 2, wherein an area of the black matrix layer is equal to or greater than 150% of a sum of areas of the pads.

4. The light emitting device of claim 1, wherein at least one of the pads is formed of a conductive carbon material and is electrically connected to at least one of the light emitting chips.

5. The light emitting device of claim 1, wherein a metal layer is disposed on the top surface of the support substrate, and
wherein the metal layer is provided under the at least one of the pads on which the at least one of the light emitting chips is disposed among the plurality of pads.

6. The light emitting device of claim 1, wherein the light emitting chips include a first light emitting chip to emit blue light, a second light emitting chip to emit green light, and a third light emitting chip to emit red light,
wherein the second light emitting chip is disposed between the first and second light emitting chips,
wherein the first to third light emitting chips are individually driven, and
wherein the pads include a first pad connected to the first to third light emitting chips.

7. The light emitting device of claim 6, wherein the first and second light emitting chips are disposed on the first pad,
wherein the pads include a second pad on which the third light emitting chip is disposed, a third pad connected to the first light emitting chip through a connection member, and a fourth pad connected to the second light emitting chip through a connection member, and
wherein the first pad has an area at least three times an area of the third pad or the fourth pad.

8. The light emitting device of claim 6, wherein an outer edge of the black matrix layer is provided under a lateral side of the transmissive resin layer.

9. The light emitting device of claim 6, wherein an area of the black matrix layer is greater than a sum of areas of the pads,
wherein the pads are spaced apart from an edge of the top surface of the support substrate,
wherein the black matrix layer has a thickness greater than a thickness of the pads,
wherein the black matrix layer is in contact with a side surface of each of the pads, and
wherein an outer surface of the black matrix layer is disposed on a same vertical plane as an outer surface of the support substrate.

10. The light emitting device of claim 6, wherein an area of the black matrix layer is less than a sum of areas of the pads,
wherein the pads are spaced apart from an edge of the top surface of the support substrate,
wherein the black matrix layer has a thickness greater than a thickness of the pads,
wherein the black matrix layer is in contact with a side surface of each of the pads, and
wherein an outer surface of the black matrix layer is disposed on a same vertical plane as an outer surface of the support substrate.

11. The light emitting device of claim 1,
wherein the light emitting chips include a first light emitting chip to emit blue light, a second light emitting chip to emit green light, and a third light emitting chip to emit red light,
wherein the pads include a first pad connected to the first to third light emitting chips,
wherein the first and second light emitting chips are provided on the black matrix layer or the first pad, and
wherein the third light emitting chip is provided on a second pad among the plurality of pads.

12. The light emitting device of claim 11, wherein the first and second light emitting chips are disposed on the first pad,
wherein the pads includes a third pad connected to the first light emitting chip through a connection member, and a fourth pad connected to the second light emitting chip through a connection member, and
wherein the first pad has an area which is equal to or up to three times greater than an area of the third pad or the fourth pad.

13. The light emitting device of claim 12, wherein the first to fourth pads are spaced apart from an edge of the top surface of the support substrate, and
wherein an outer edge of the black matrix layer is provided under a lateral side of the transmissive resin layer.

14. The light emitting device of claim 1, wherein a number of the pads is greater than a number of the light emitting chips.

15. The light emitting device of claim 1, wherein centers of the light emitting chips are arranged in a straight line.

16. The light emitting device of claim 1, wherein at least one of the light emitting chips emits ultraviolet light and has at least one of blue, green, or red phosphor layers.

17. The light emitting device of claim 1, further comprising:
- a plurality of lead electrodes under the support substrate; and
- a plurality of via electrodes provided in the support substrate to connect the lead electrodes to the pads, respectively.

18. The light emitting device of claim 1, wherein at least one of the black matrix layer, the transmissive resin layer, or the pad includes roughness having a concavo-convex shape.

19. The light emitting device of claim 1, wherein at least one of the pads includes a conductive carbon black material and is electrically connected to at least one of the light emitting chips,
- wherein the light emitting chips include a first light emitting chip to emit blue light, a second light emitting chip to emit green light, and a third light emitting chip to emit red light,
- wherein the pads include a first pad connected to the first to third light emitting chips,
- wherein the first and second light emitting chips are provided on the black matrix layer or the first pad,
- wherein the pads include a second pad on which the third light emitting chip is disposed, a third pad connected to the first light emitting chip through a connection member, and a fourth pad connected to the second light emitting chip through a connection member, and
- wherein the first pad has an area at least three times an area of the third pad or the fourth pad.

* * * * *